US009355908B2

(12) United States Patent
Saitoh

(10) Patent No.: US 9,355,908 B2
(45) Date of Patent: May 31, 2016

(54) SEMICONDUCTOR PILLAR TRANSISTORS HAVING CHANNELS WITH DIFFERENT CRYSTAL ORIENTATIONS

(71) Applicant: KABUSHIKI KAISHA TOSHIBA, Minato-ku (JP)

(72) Inventor: Masumi Saitoh, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/026,241

(22) Filed: Sep. 13, 2013

(65) Prior Publication Data

US 2014/0117366 A1    May 1, 2014

(30) Foreign Application Priority Data

Oct. 31, 2012  (JP) ................................. 2012-241137

(51) Int. Cl.
| | |
|---|---|
| *H01L 29/66* | (2006.01) |
| *H01L 21/8234* | (2006.01) |
| *H01L 29/12* | (2006.01) |
| *H01L 29/78* | (2006.01) |
| *H01L 27/088* | (2006.01) |
| *H01L 29/04* | (2006.01) |
| *H01L 27/24* | (2006.01) |
| *H01L 29/06* | (2006.01) |

(52) U.S. Cl.
CPC ...... *H01L 21/823412* (2013.01); *H01L 21/823487* (2013.01); *H01L 27/088* (2013.01); *H01L 29/045* (2013.01); *H01L 29/125* (2013.01); *H01L 29/66439* (2013.01); *H01L 29/66666* (2013.01); *H01L 29/7827* (2013.01); *H01L 27/2454* (2013.01); *H01L 29/0676* (2013.01)

(58) Field of Classification Search
CPC ............ H01L 29/045; H01L 29/66666; H01L 29/7827; H01L 29/0676; H01L 29/125; H01L 29/66439
USPC .................. 257/329, 331, E29.262, E21.693, 257/E21.41
See application file for complete search history.

(56) References Cited

U.S. PATENT DOCUMENTS

| | | | | |
|---|---|---|---|---|
| 6,483,171 | B1 * | 11/2002 | Forbes et al. ................. | 257/627 |
| 6,943,407 | B2 * | 9/2005 | Ouyang et al. ................ | 257/329 |
| 7,230,286 | B2 * | 6/2007 | Cohen et al. .................. | 257/210 |
| 7,785,939 | B2 * | 8/2010 | de Souza et al. ............. | 438/150 |
| 2010/0207172 | A1 * | 8/2010 | Masuoka et al. .............. | 257/255 |

FOREIGN PATENT DOCUMENTS

| | | |
|---|---|---|
| JP | 5-3212 | 1/1993 |
| JP | 5-243575 | 9/1993 |

* cited by examiner

*Primary Examiner* — Jesse Y Miyoshi
(74) *Attorney, Agent, or Firm* — Oblon, McClelland, Maier & Neustadt, L.L.P.

(57) ABSTRACT

According to an embodiment, a semiconductor device includes an underlying layer and a plurality of transistors. The underlying layer includes a first region and a second region provided adjacently to the first region. The transistors are arranged in a plane parallel to an upper surface of the underlying layer. Each transistor includes a channel allowing a current to flow in a first direction intersecting the plane. The plurality of transistors includes a first transistor provided on the first region and a second transistor provided on the second region, a first channel of the first transistor having a first crystal orientation, and a second channel of the second transistor having a second crystal orientation different from the first crystal orientation.

7 Claims, 18 Drawing Sheets

SEMICONDUCTOR PILLAR TRANSISTORS HAVING CHANNELS WITH DIFFERENT CRYSTAL ORIENTATIONS

CROSS-REFERENCE TO RELATED APPLICATIONS

This application is based upon and claims the benefit of priority from Japanese Patent Application No. 2012-241137, filed on Oct. 31, 2012; the entire contents of which are incorporated herein by reference.

FIELD

Embodiments are generally related to a semiconductor device and a method for manufacturing the same.

BACKGROUND

Technology for higher integration of nonvolatile memory LSI typified by NAND flash memory is progressing toward the three-dimensional memory cell arrangement beyond the size reduction of memory cells with the two-dimensional arrangement. For example, a device structure has been under developing, which includes a substrate layer having a control circuit, a switching (transistor) unit selecting designated memory cells in the programming/reading operations, and a three-dimensional memory cell unit that are stacked in this order. In such a structure, it is necessary to deposit the transistor channel on an insulating film or on a metal interconnect in order to form a selection transistor on the substrate layer. Therefore, polycrystalline silicon is used instead of monocrystalline silicon as the channel of the selection transistor.

However, the carrier mobility of polycrystalline silicon is less than the carrier mobility of monocrystalline silicon. Therefore, a sufficient current (driving ability) is not obtained when downscaling the polycrystalline silicon transistor; and it is likely that the reading/programming speed of the memory degrades. Therefore, a polycrystalline silicon transistor is necessary to maintain a high driving ability (mobility) even when the channel size is reduced.

DETAILED DESCRIPTION

Figure 1A:
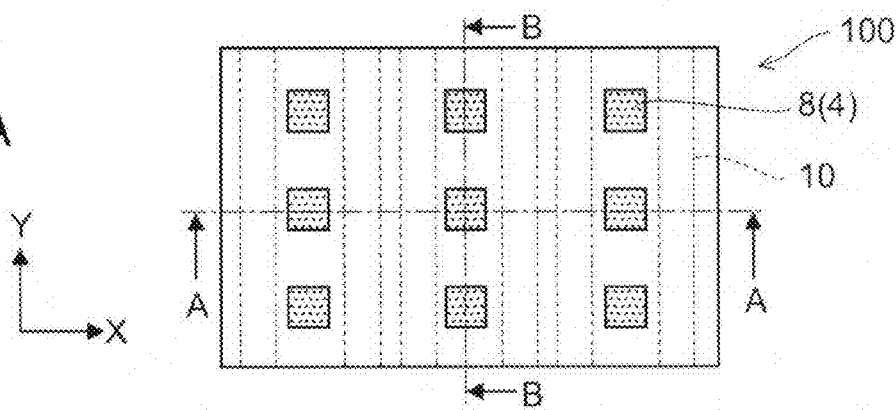
FIGS. 1A to 1C are schematic views showing a semiconductor device according to a first embodiment.

According to an embodiment, a semiconductor device includes an underlying layer and a plurality of transistors. The underlying layer includes a first region and a second region provided adjacently to the first region. The transistors are arranged in a plane parallel to an upper surface of the underlying layer. Each transistor includes a channel allowing a current to flow in a first direction intersecting the plane. The plurality of transistors includes a first transistor provided on the first region and a second transistor provided on the second region, a first channel of the first transistor having a first crystal orientation, and a second channel of the second transistor having a second crystal orientation different from the first crystal orientation.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
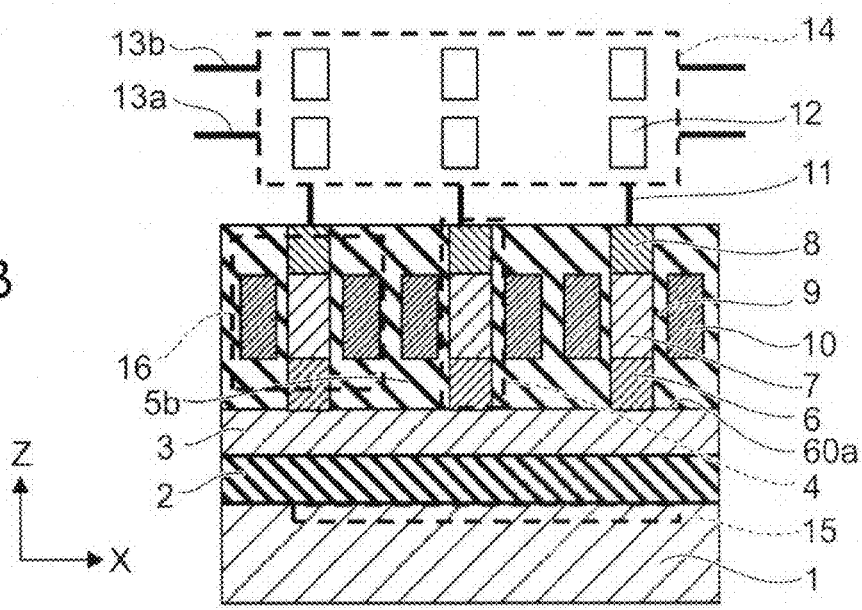
Figure 1C:
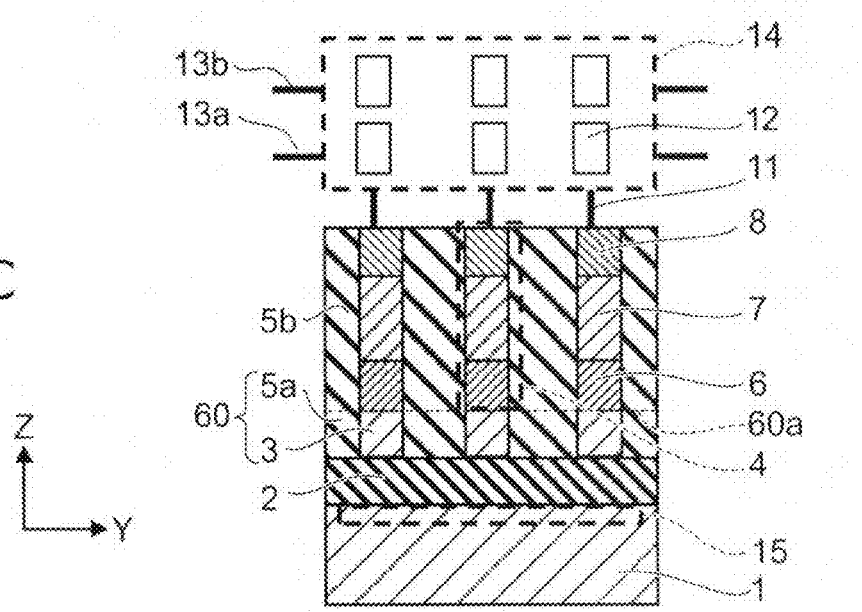

FIGS. 1A to 1C are schematic views showing a semiconductor device 100 according to a first embodiment.

FIG. 1A is a top view of the semiconductor device 100.

FIG. 1B is a schematic cross-sectional view along line A-A of FIG. 1A.

FIG. 1C is a schematic cross-sectional view along line B-B.

In the embodiment, the Z direction of the XYZ orthogonal coordinate system shown in the drawings is the channel direction (the channel length direction) of a transistor 16; the X direction is the channel thickness direction; and the Y direction is the channel width direction.

The semiconductor device 100 includes an underlying layer 60, which includes a metal layer 3, and an insulator layer 5a, and the transistor 16 provided on the underlying layer 60. The transistor 16 is provided on, for example, the metal layer 3 and includes a semiconductor pillar 4 extending in the Z direction. The semiconductor pillar 4 includes a source 6, a channel 7, and a drain 8 provided in order from the metal layer 3 side. A gate insulating film 9 is provided at the side surface of the semiconductor pillar 4. The gate insulating film 9 covers, for example, the side surface of the channel 7. The gate insulating film 9 is provided between a gate electrode 10 and the channel 7. The gate electrode 10 is provided to oppose the channel 7 with the gate insulating film 9 interposed. The transistor 16 includes the channel 7. The channel 7 allows a current to flow in a direction (a first direction) intersecting a major surface 60a (the upper surface) of the underlying layer 60. The first direction intersects a plane parallel to the underlying layer 60. For example, the first direction is a direction (the Z direction) perpendicular to the major surface 60a. The side surface of the channel 7 is a surface parallel to the first direction.

The semiconductor pillar 4 may be, for example, a so-called nanowire provided in a fine wire configuration. The height of the semiconductor pillar 4 in the Z direction may be about the same as the widths in the X direction and the Y direction of the semiconductor pillar 4. The height of the semiconductor pillar 4 in the Z direction may be less than the widths in the X direction and the Y direction of the semiconductor pillar 4. The semiconductor pillar 4 may have a box-like configuration.

Multiple transistors 16 are provided on the underlying layer 60. One group of the multiple transistors 16 includes first channels having a first crystal orientation. On the other hand, one other group of the multiple transistors includes second channels having a second crystal orientation that is different from the first crystal orientation (referring to FIG. 13).

The semiconductor device 100 is, for example, a nonvolatile memory device that includes a memory cell array 14 provided on a silicon substrate 1. The semiconductor device 100 includes the multiple transistors 16 provided between the silicon substrate 1 and the memory cell array 14. The transistors 16 function as selection transistors.

As shown in FIG. 1B and FIG. 1C, the metal layers 3 are provided on the silicon substrate 1 with an insulator layer 2 interposed. The metal layers 3 are provided in stripe configurations extending in the X direction. Multiple metal layers 3 are arranged in the Y direction. The metal layers 3 function as, for example, global bit lines. A memory control circuit 15 may be provided between the silicon substrate 1 and the insulator layer 2.

Multiple semiconductor pillars 4 are provided on the metal layers 3. The semiconductor pillars 4 include the channels 7 of the transistors 16 and function as, for example, local bit lines electrically connecting the metal layers 3 to the memory cell array 14.

The transistors 16 that include the semiconductor pillars 4 are electrically connected to memory cells 12 by metal interconnects 11. The metal interconnects 11 function as, for example, metal local bit lines.

The memory cell array 14 includes multiple memory cells 12, and interconnects 13a and 13b that are electrically connected to the memory cells 12. The memory cells 12 may be, for example, resistance change memory cells or charge storage memory cells. The interconnects 13a and 13b function as, for example, word lines.

Although the memory cell array 14 shown in FIGS. 1B and 1C has a structure in which the memory cells 12 are stacked in two levels, this is not limited thereto. For example, the memory cells 12 may be stacked in one, three, or more levels.

The semiconductor pillar 4 is formed of, for example, polycrystalline silicon; and the source 6 and the drain 8 are doped with an n-type impurity. The channel 7 is provided to have a thickness (the width in the X direction) and a width (the width in the Y direction) of, for example, 3 nanometers (nm) to 30 nm.

The channel 7 does not include the impurity; or, in the case where the channel 7 includes the impurity, the concentration is lower than those of the source 6 and the drain 8.

The average grain size of the polycrystalline silicon included in the channel 7 is not less than 10 times a channel length Lc. The grain size of the polycrystalline silicon can be measured by, for example, a transmission electron microscope (TEM).

The gate electrode 10 may include, for example, a polycrystalline silicon single film, a single film including a metal-semiconductor compound such as a metal silicide, etc., a metal film of TiN, W, TaC, etc., or a stacked film of such films. For example, a stacked film of a metal-semiconductor compound film and a semiconductor film such as polycrystalline silicon, etc., or a stacked film of a metal film and a polycrystalline silicon film may be used.

A silicon oxide film, a silicon oxynitride film, or a high dielectric constant film (high-k film) such as a hafnium oxide film, a zirconium oxide film, etc., or a stacked structure of a silicon oxide film and a high dielectric constant film are applicable to the gate insulating film 9.

Tungsten, titanium nitride, a stacked film of tungsten and titanium nitride, etc., are applicable to the metal layer 3 and the metal interconnect 11.

When accessing (programming/erasing/reading) the memory cell array 14, the transistors 16 connected to the memory cells 12 are controlled to be on/off. For example, the transistor 16 connected to the memory cell 12 to be selected is switched to the on-state by applying a positive voltage to the gate electrode 10 of the transistor 16. Simultaneously, the transistor 16 connected to the memory cell 12 to be unselected is switched to the off-state by applying a negative voltage to the gate electrode 10 of the transistor 16.

A method for manufacturing the semiconductor device 100 will now be described.

FIG. 2A to FIG. 5B are schematic views showing the method for manufacturing the semiconductor device 100.

Figure 2A:
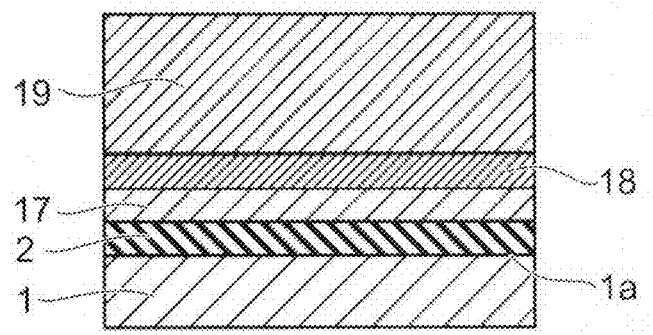
FIGS. 2A to 5B are schematic views showing a method for manufacturing the semiconductor device according to the first embodiment.
Figure 2B:
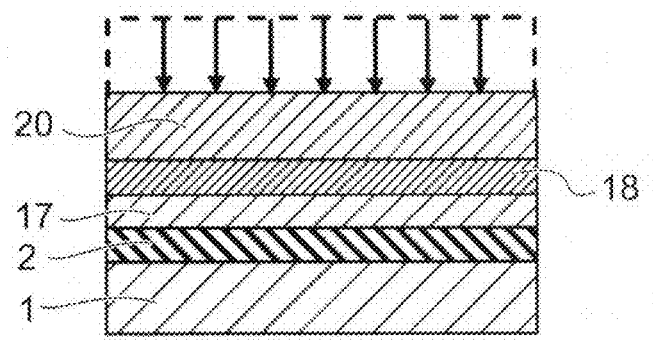
Figure 2C:
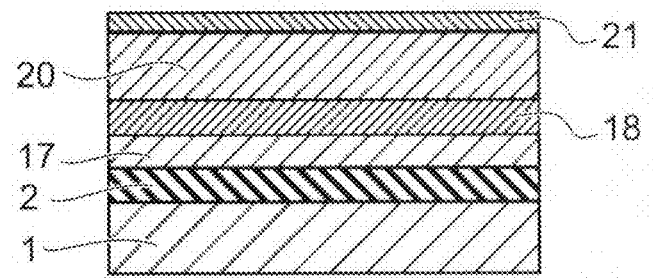

FIG. 2A to FIG. 2C are partial cross-sections of the silicon substrate 1 in manufacturing processes of the semiconductor device 100.

Figure 3A:
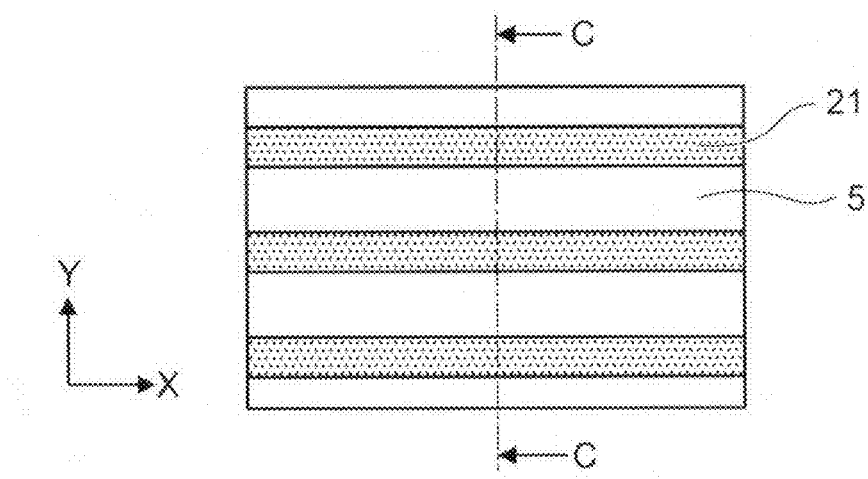
Figure 4A:
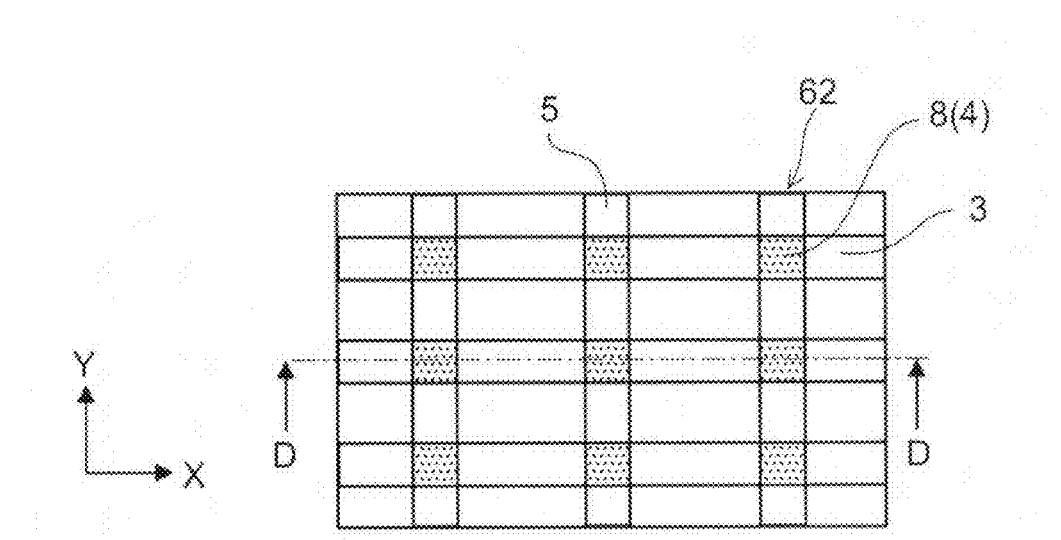
Figure 5A:
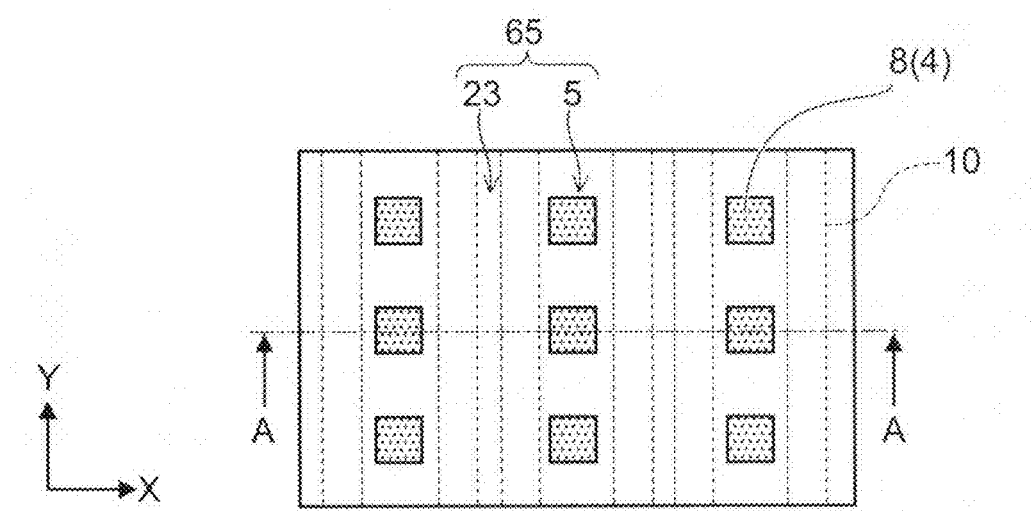

FIG. 3A, FIG. 4A, and FIG. 5A are plan views showing the upper surface of the silicon substrate 1.

Figure 3B:
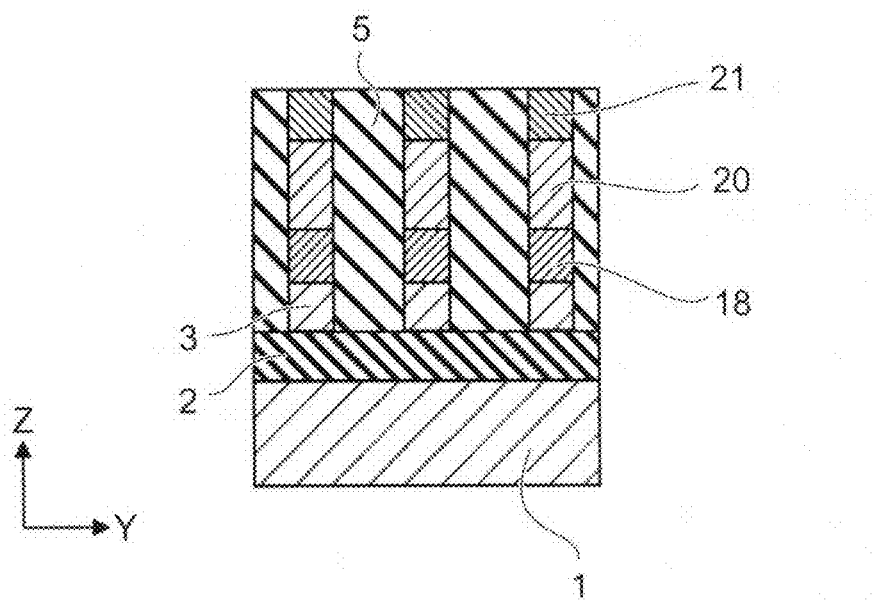
Figure 4B:
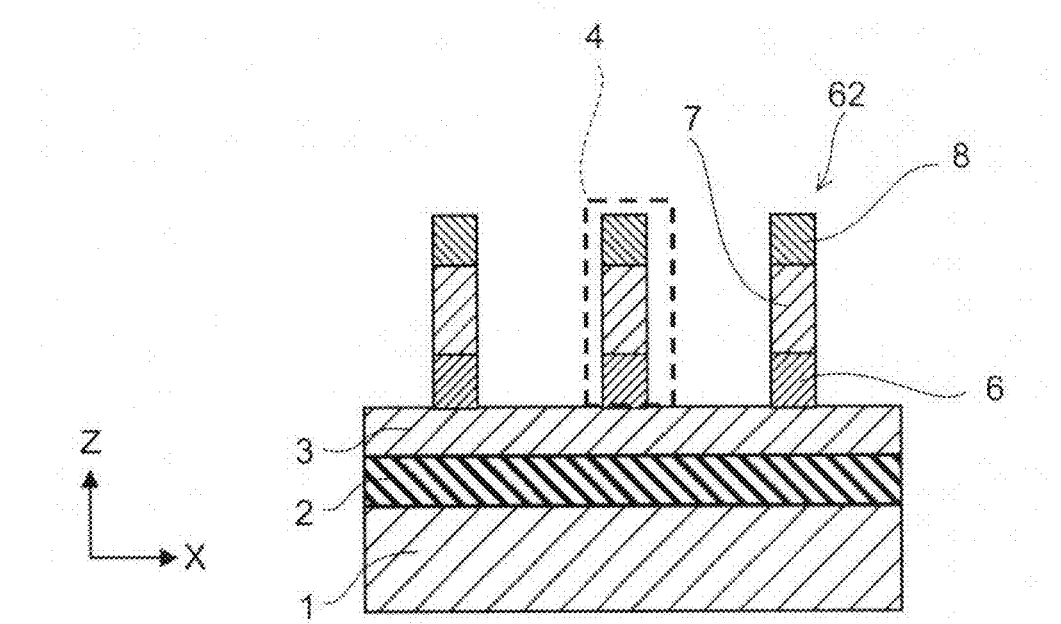
Figure 5B:
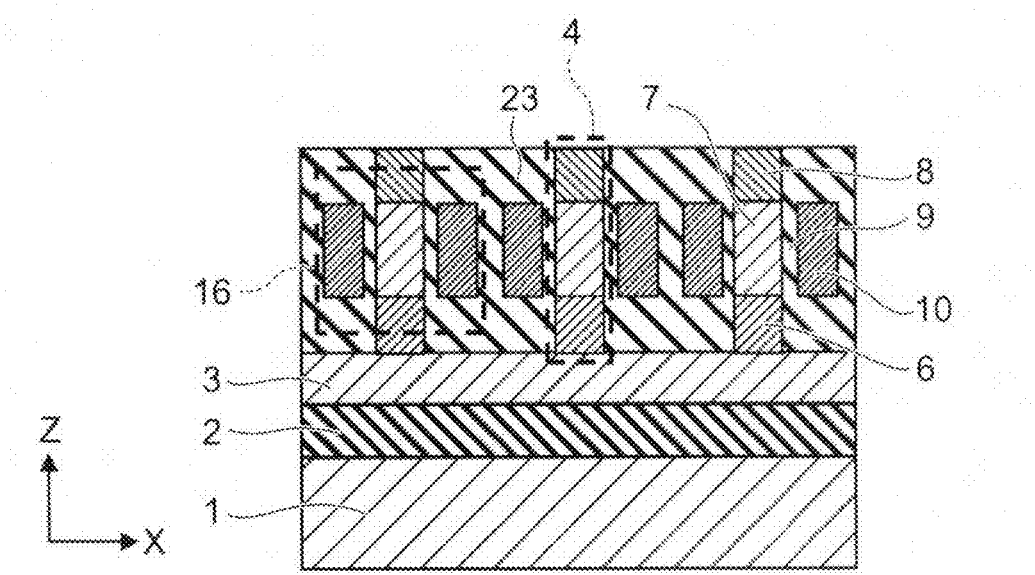

FIG. 3B, FIG. 4B, and FIG. 5B are cross-sectional views along line C-C, line D-D, and line A-A of FIG. 3A to FIG. 5A, respectively.

First, as shown in FIG. 2A, the insulator layer 2, a metal layer 17, a polycrystalline semiconductor layer (a fourth polycrystalline semiconductor layer 18), and a first semiconductor layer 19 are formed on the silicon substrate 1. As shown in FIGS. 1A to 1C, the memory control circuit 15 may be provided at a front surface is of the silicon substrate 1.

The polycrystalline semiconductor layer 18 is, for example, a polycrystalline silicon layer doped with an impurity of the n type (the first conductivity type). The first semiconductor layer 19 is, for example, a non-doped amorphous silicon layer. The thickness (a first thickness) of the first semiconductor layer 19 is, for example, not less than 100 nm and not more than 600 nm.

Being non-doped is when, for example, an impurity is not doped deliberately. The impurity concentration of a non-doped layer may be, for example, not more than the intrinsic carrier concentration of the semiconductor. This is not limited thereto; and the non-doped layer may include finite impurities. For example, the n-type impurity may be included at a concentration that is lower than that of the polycrystalline semiconductor layer 18. Although the first conductivity type is described as the n type in the description hereinbelow, the first conductivity type may be the p type.

Then, a first polycrystalline semiconductor layer 20 is formed by crystallizing the first semiconductor layer 19 by performing heat treatment of the first semiconductor layer 19 (a first process). For example, in the case where the first semiconductor layer 19 is an amorphous silicon layer, the amorphous silicon layer becomes a polycrystalline silicon layer by the crystallization by performing the heat treatment.

The heat treatment temperature is, for example, not less than 550° C. and not more than 1200° C. For example, a resistance heating furnace, a RTA (Rapid Thermal Annealing) furnace, a flash lamp annealing furnace, or the like is used in the heat treatment. In the case where the resistance heating furnace is used, the heat treatment time is, for example, several minutes to several tens of hours; and in the case where the RTA furnace is used, the heat treatment time is several seconds to several hundreds of seconds. In the case where the flash lamp annealing furnace is used, millisecond annealing is possible.

Then, as shown in FIG. 2B, the thickness of the first polycrystalline semiconductor layer 20 is reduced to a second thickness that is thinner than the first thickness (a second process). The second thickness is, for example, not less than 10 nm and not more than 80 nm. For example, reactive ion etching (RIE), wet etching, thermal oxidation, CMP (Chemical Mechanical Polishing), or the like is used as the method for reducing the thickness of the first polycrystalline semiconductor layer 20.

Continuing as shown in FIG. 2C, a second polycrystalline semiconductor layer 21 is formed on the thinned first polycrystalline semiconductor layer 20 (a third process). The second polycrystalline semiconductor layer 21 is, for example, a polycrystalline silicon layer doped with an n-type impurity.

The second polycrystalline semiconductor layer 21 may be, for example, a polycrystalline silicon layer formed by CVD (Chemical Vapor Deposition). The polycrystalline semiconductor layer may be, for example, a polycrystalline silicon layer formed by forming a second semiconductor layer, e.g., a second amorphous silicon layer, on the first polycrystalline semiconductor layer 20 and subsequently crystallizing the second semiconductor layer by heat treatment of the second semiconductor layer.

Continuing as shown in FIG. 3A and FIG. 3B, the metal layer 17, the fourth polycrystalline semiconductor layer 18, the first polycrystalline semiconductor layer 20, and the second polycrystalline semiconductor layer 21 are patterned.

The stacked body including the metal layer 17, the polycrystalline semiconductor layer 18, the first polycrystalline semiconductor layer 20, and the second polycrystalline semiconductor layer 21 is patterned into, for example, plate configurations that extend in the X direction and are arranged in the Y direction. For example, RIE is used to perform the patterning. The Y-direction width of the stacked bodies having the plate configurations is, for example, not less than 3 nm and not more than 30 nm. Here, the metal layer 17 is patterned into the metal layers 3 having multiple stripe configurations extending in the X direction.

Continuing, an insulator layer 5 is filled between the stacked bodies having the plate configurations. The insulator layer 5 is, for example, a silicon oxide film and functions as an inter-local bit line oxide film. The insulator layer 5 functions as the insulator layer 5a and an insulator layer 5b.

Then, as shown in FIG. 4A and FIG. 4B, the semiconductor pillars 4 are formed by patterning the stacked bodies (the first plate-like bodies) having the plate configurations (a fourth process).

For example, the semiconductor pillars 4 and second plate-like bodies 62 that include the insulator layer 5 are formed by patterning the insulator layer 5 and the stacked bodies having the plate configurations in the Y direction which is perpendicular to the extension direction of the stacked bodies (the X direction). The width of the second plate-like bodies 62 in the X direction is, for example, not less than 3 nm and not more than 30 nm.

The semiconductor pillars 4 are provided on the metal layers 3. The polycrystalline semiconductor layer 18, the first polycrystalline semiconductor layer 20, and the second polycrystalline semiconductor layer 21 are patterned into the source 6, the channel 7, the drain 8, respectively, of each of the transistors 16. For example, the polycrystalline semiconductor layer 18, the first polycrystalline semiconductor layer 20, and the second polycrystalline semiconductor layer 21 are selectively etched to leave the semiconductor pillars 4. Each of the semiconductor pillars 4 is formed to include the source 6, the channel 7, and the drain 8 of the transistor 16.

Then, as shown in FIG. 5A and FIG. 5B, the gate electrode 10 is formed between the mutually-adjacent second plate-like bodies 62; and an insulator layer 23 is formed to fill between the second plate-like bodies 62.

For example, an insulating film that is used to form the gate insulating film 9 is formed on the side surface of the second plate-like body 62. Continuing, an electrode material that is used to form the gate electrodes 10 is deposited on the gate insulating film 9. Subsequently, for example, the gate electrodes 10 are formed at two sides of the channel 7 by RIE (a process that leaves sidewalls). Although the gate electrodes 10 are provided in stripe configurations extending in the Y direction in the embodiment, this is not limited thereto.

The transistors 16 are completed by filling the insulator layer 23 between the second plate-like bodies 62 for which the gate electrodes 10 are formed. The insulator layer 23 is, for example, a silicon oxide film. The insulator layer 23 functions with the insulator layer 5 as, for example, an inter-layer insulating film 65.

As shown in FIG. 5A and FIG. 5B, the transistors 16 are buried in the inter-layer insulating film 65; and the drain 8 of each of the transistors is exposed at the front surface of the transistor 16. The memory cell array 14 is formed after forming the metal interconnects 11 on the inter-layer insulating film 65 (referring to FIGS. 1A to 1C). The metal interconnects 11 are formed to electrically connect the drains 8 of the transistors 16 to the memory cells 12.

Characteristics of the transistor 16 will now be described with reference to FIG. 6 to FIG. 13.

FIG. 6 to FIG. 10 are graphs showing characteristics of the transistor 16 according to the embodiment.

Figure 11A:
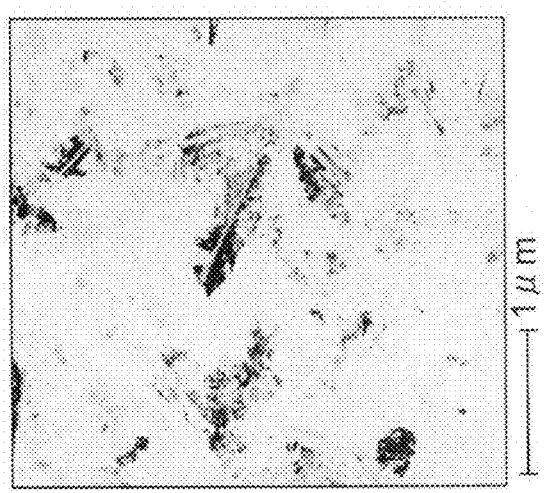
FIGS. 11A and 11B are a TEM image and a graph showing a characteristic of the transistor according to the first embodiment.
Figure 11B:
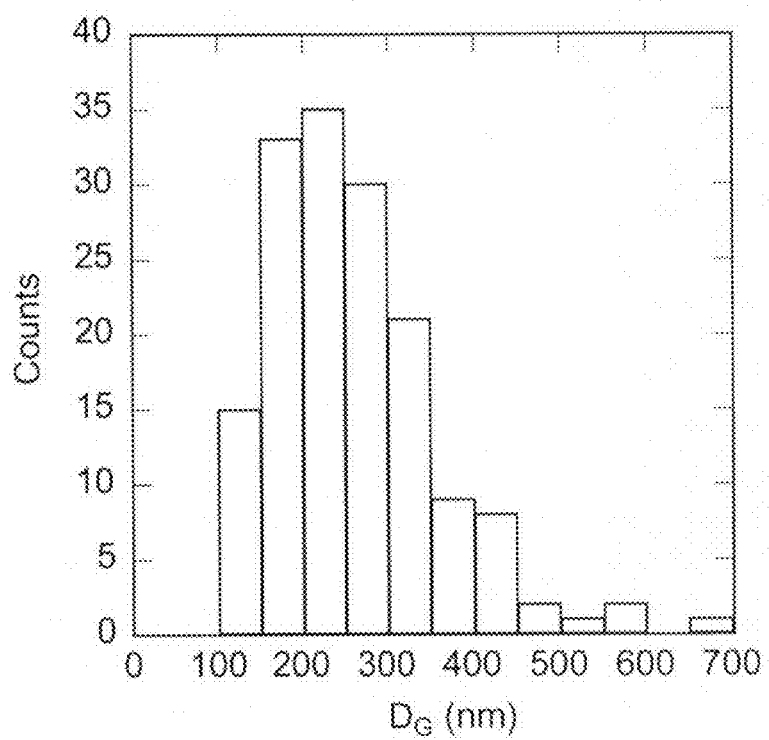

FIGS. 11A and 11B are a TEM image and a graph showing a characteristic of the transistor 16 according to the embodiment.

Figure 12A:
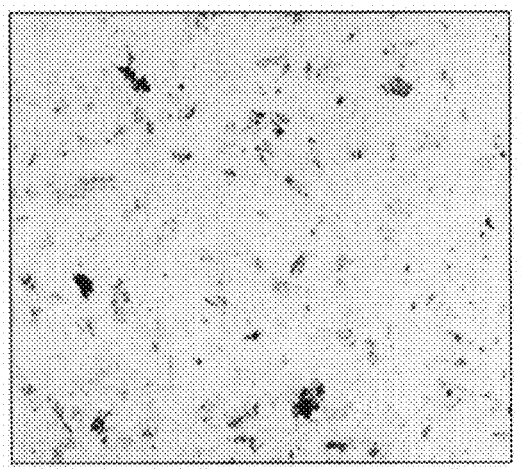
FIGS. 12A and 12B are a TEM image and a graph showing a characteristic of a transistor according to a reference example.
Figure 12B:
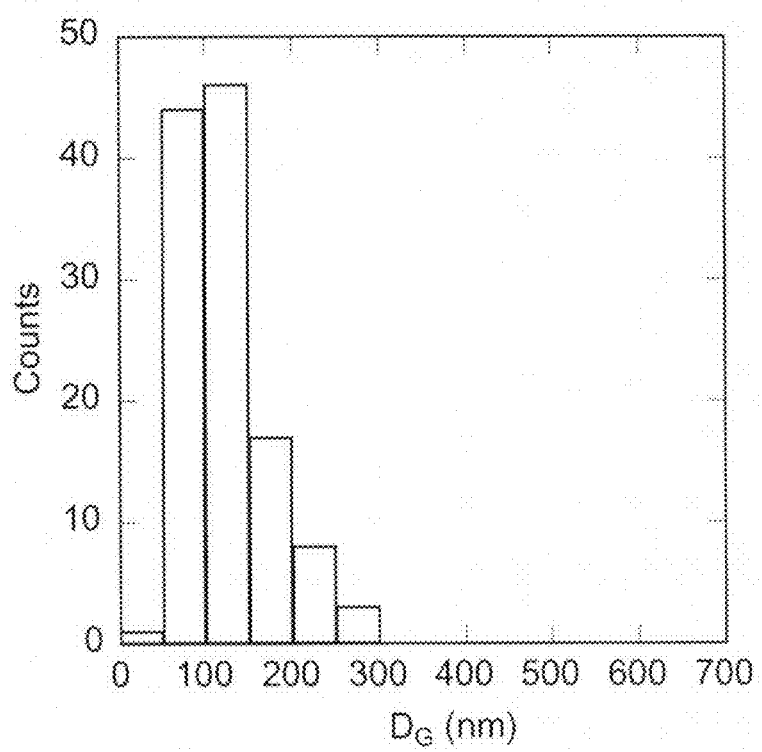

FIGS. 12A and 12B are a TEM image and a graph showing a characteristic of a transistor according to a reference example.

Figure 13:
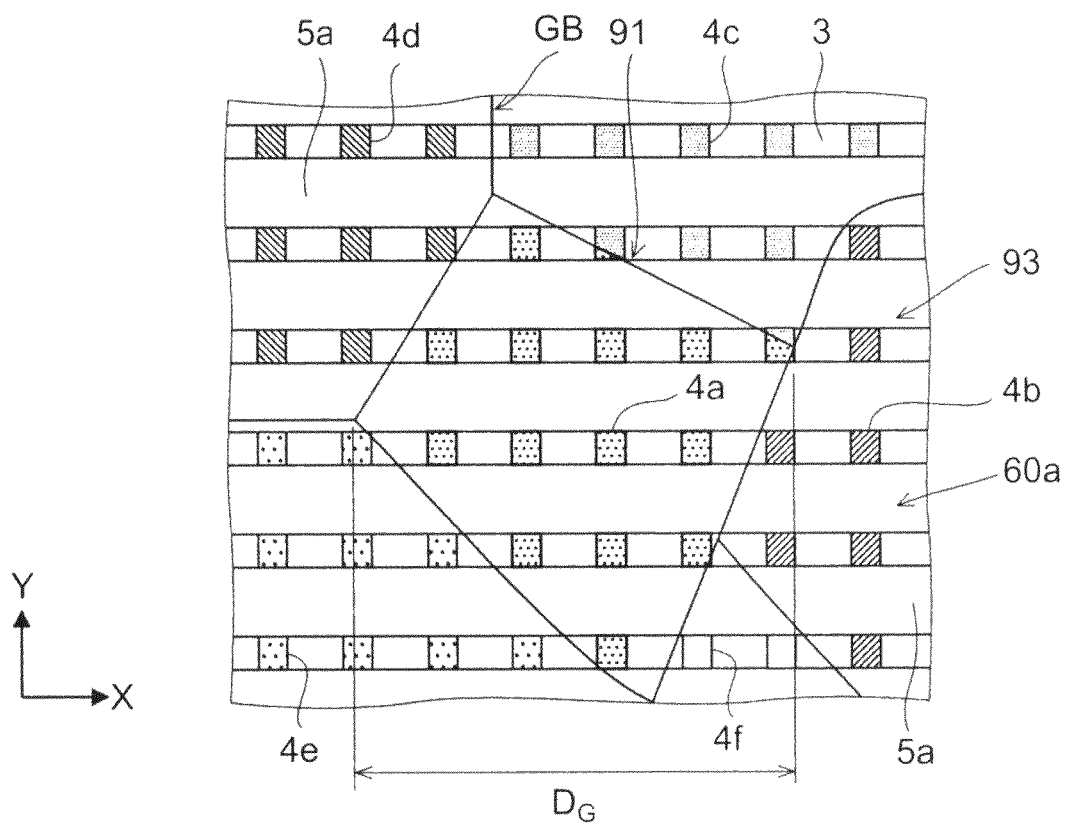
FIG. 13 is a schematic view showing characteristics of the transistor according to the first embodiment.

FIG. 13 is a schematic view showing characteristics of the transistor 16 according to the embodiment.

Figure 6:
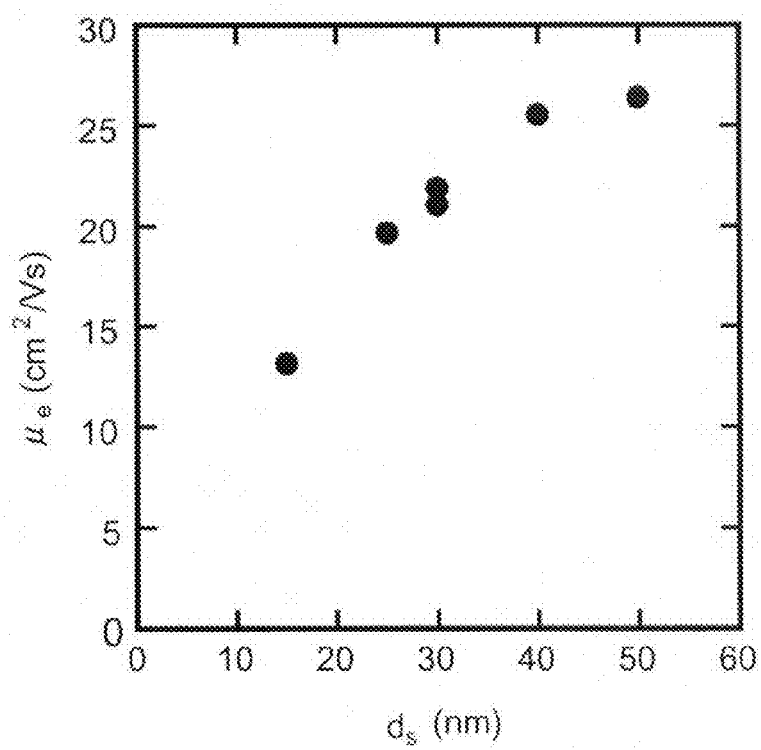
FIGS. 6 to 10 are graphs showing characteristics of the transistor according to the first embodiment.

FIG. 6 is a graph showing the relationship between a mobility $\mu_e$ and a film thickness $d_s$ of the polycrystalline silicon layer. The horizontal axis is the film thickness $d_s$ of the polycrystalline silicon layer. The vertical axis is the channel mobility $\mu_e$ of the polycrystalline silicon transistor (having a channel length of 10 μm and a gate width of 100 μm). Here, the polycrystalline silicon layer is formed by crystallizing an amorphous silicon layer by heat treatment of the amorphous silicon layer. Accordingly, the film thicknesses of the amorphous silicon layer and the polycrystalline silicon layer are the same.

As shown in FIG. 6, the channel mobility $\mu_e$ decreases abruptly as the film thickness $d_s$ of the polycrystalline silicon layer decreases. It may be considered that the reason for this is as follows.

The size of the crystal grain (the grain) included in the polycrystalline silicon formed by crystallizing the amorphous silicon depends on the film thickness of the amorphous silicon layer. The grain size after the crystallization decreases as the film thickness of the amorphous silicon layer decreases. Also, the number of boundaries (grain boundaries) between grains in the interior of the polycrystalline silicon increases as the grain size decreases.

On the other hand, the carriers that travel through the channel of the transistor are subjected to Coulomb scattering due to the charge of the crystal defects existing at the grain boundaries; and the mobility of the carriers degrades. For channels of the same size, the grain boundaries increase when crystals having smaller grain sizes are used. Therefore, the channel mobility $\mu_e$ may decrease when polycrystalline silicon having a small grain size is used.

The current flowing through the transistor depends on the channel mobility $\mu_e$. For a polycrystalline silicon transistor having a small channel mobility $\mu_e$, there are cases where the current that drives the memory cells (the driving ability) is insufficient and the operation speed of the memory decreases. For example, in the case where a polycrystalline silicon transistor having a channel width and thickness that are not more than 30 nm is used as the selection transistor of the memory cell, there are cases where a sufficient current (driving ability) is not obtained and the reading/programming speed decreases. In the case where the size of the selection transistor or the number of channels is increased to maintain the operation speed of the memory cell, the chip surface area may increase; and the bit count per chip may decrease.

In the embodiment, the deposition thickness of the amorphous silicon layer on which the crystallization is performed is, for example, not less than 100 nm. Then, after forming a polycrystalline silicon layer having grains of a sufficient size, the thickness of the polycrystalline silicon layer is reduced to a prescribed thickness. Thereby, a high channel mobility $\mu_e$ can be obtained while reducing the channel size and enlarging the grain size. As a result, the driving ability of the selection transistor can be increased; and the operation speed of the memory cell can be increased.

Figure 7:
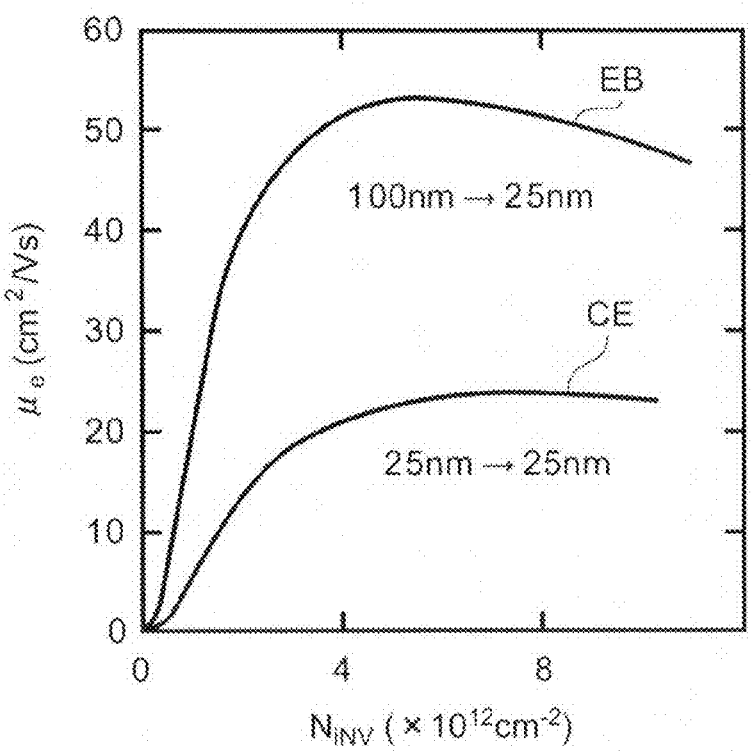

FIG. 7 is a graph showing the relationship between the channel mobility $\mu_e$ and a carrier density $N_{inv}$ of the inversion channel of the polycrystalline transistor manufactured by the manufacturing method according to the embodiment. The horizontal axis is the carrier density $N_{inv}$; and the vertical axis is the channel mobility $\mu_e$.

For example, an amorphous silicon layer having a thickness of 100 nm is deposited on a thermal oxide film having a thickness of 100 nm; and crystallization annealing is performed for two hours at 600° C. in a resistance heating furnace. After the annealing, the thickness of the polycrystalline silicon is reduced by reactive ion etching to a thickness of 25 nm. Then, a polycrystalline silicon transistor having a channel length of 10 μm and a gate width of 100 μm is made.

FIG. 7 shows the channel mobility $\mu_e$ of a transistor EB according to the embodiment and the channel mobility $\mu_e$ of a transistor CE according to a reference example. The transistor EB includes a channel formed by crystallizing an amorphous silicon layer having a thickness of 100 nm and reducing the thickness of the silicon layer to a thickness of 25 nm. The transistor CE includes a channel that is a polycrystalline silicon layer having a thickness of 25 nm formed by crystallizing an amorphous silicon layer having a thickness of 25 nm. As shown in this drawing, the channel mobility $\mu_e$ of the transistor EB is about twice the channel mobility $\mu_e$ of the transistor CE. The maximum value of the channel mobility $\mu_e$ of the transistor EB exceeds 50 cm$^2$/V·s.

Figure 8:
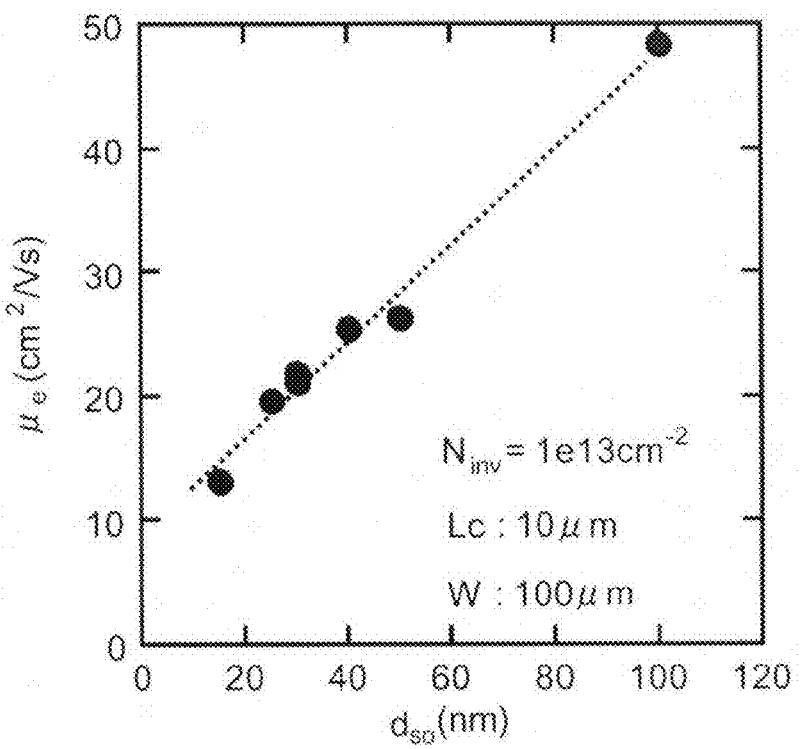

FIG. 8 is a graph showing the relationship between the channel mobility $\mu_e$ of the polycrystalline transistor and a thickness $d_{SO}$ of the amorphous silicon layer. The horizontal axis is the thickness $d_{SO}$ of the amorphous silicon layer; and the vertical axis is the channel mobility $\mu_e$ for the case where the carrier density of the inversion channel is set to be $1 \times 10^{13}$ cm$^{-2}$.

The channel mobility $\mu_e$ increases as the thickness $d_{SO}$ of the amorphous silicon layer increases. The channel mobility of the transistor EB that uses a polycrystalline silicon layer formed by crystallizing an amorphous silicon layer having a thickness of 100 nm and reducing the thickness of the silicon layer to a thickness of 25 nm is a value that corresponds to an amorphous silicon layer having a film thickness of 100 nm. An even higher channel mobility can be obtained by setting the thickness $d_{SO}$ of the amorphous silicon layer to be 100 nm or more.

Figure 9:
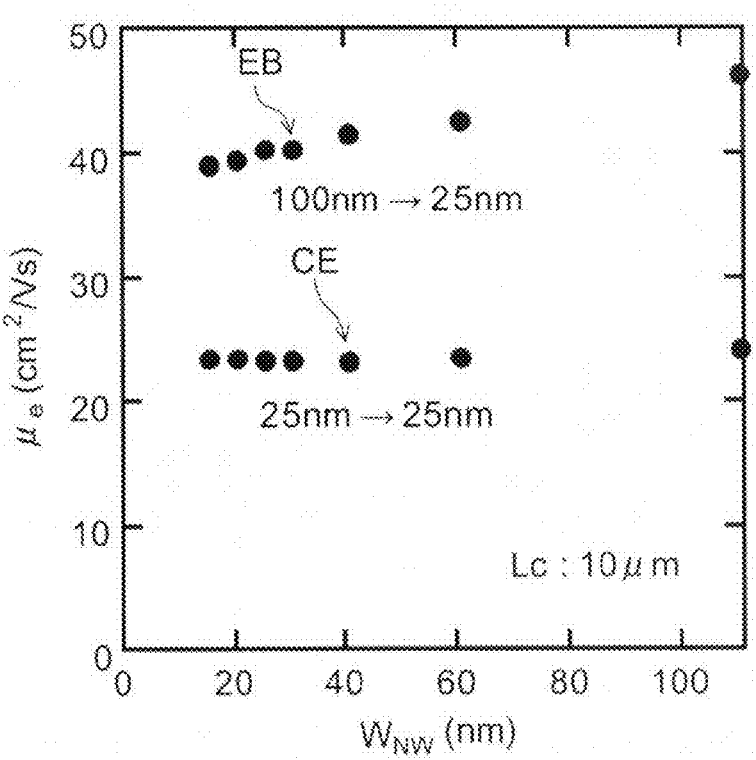

FIG. 9 is a graph showing the relationship between the channel mobility $\mu_e$ and a channel width $W_{NW}$ of the polycrystalline transistor. The horizontal axis is the channel width $W_{NW}$; and the vertical axis is the channel mobility $\mu_e$.

Figure 10:
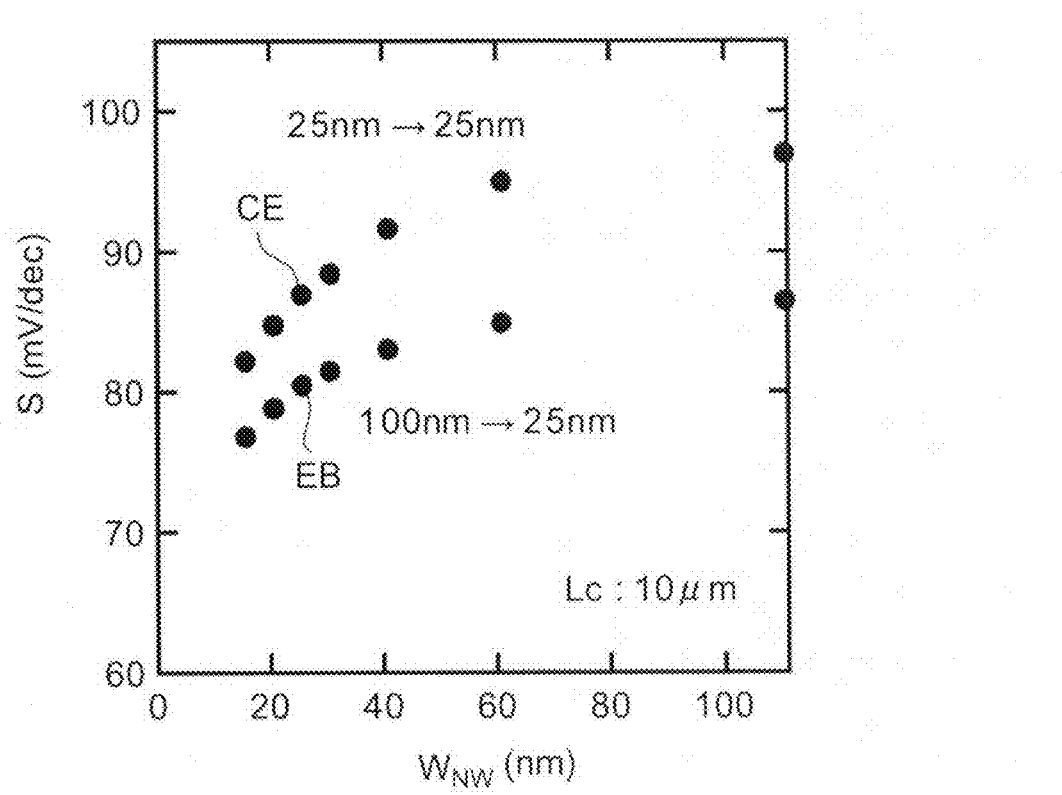

FIG. 10 is a graph showing the relationship between the S factor (mV/dec) and the channel width $W_{NW}$ of the polycrystalline transistor. The horizontal axis is the channel width $W_{NW}$; and the vertical axis is the S factor.

FIG. 9 and FIG. 10 show the channel mobility $\mu_e$ and the S factor of the transistor EB according to the embodiment and the channel mobility $\mu_e$ and the S factor of the transistor CE according to the reference example. The transistor EB includes a channel formed by, for example, reducing the thickness of a polycrystalline silicon layer having a thickness of 100 nm (formed by crystallizing an amorphous silicon layer) to a thickness of 25 nm and patterning the silicon layer into polycrystalline silicon nanowires. The transistor CE is a nanowire transistor including a channel formed of polycrystalline silicon that is not thinned (formed by crystallizing amorphous silicon having a thickness of 25 nm). For both, the channel length Lc is 10 μm.

According to FIG. 9 and FIG. 10, even in the case where the channel width $W_{NW}$ is not more than 20 nm, the channel mobility $\mu_e$ is higher and the S factor is lower for the transistor EB than for the transistor CE. It is considered that the difference between the characteristics is caused by the different grain sizes inside the channels and corresponds to the difference between the number of grain boundaries.

Thus, according to the embodiment, it is possible to increase the channel mobility $\mu_e$ and the driving ability of the transistor. It is also possible to reduce the S factor of the transistor, reduce the off-state current, and reduce the power consumption. It is possible to reduce the channel size (to be a nanowire) and realize both a high driving ability and low power consumption.

FIG. 11A is a TEM image of a polycrystalline silicon layer after crystallizing an amorphous silicon layer having a thickness of 100 nm and reducing the thickness of the silicon layer to a thickness of 25 nm.

FIG. 11B shows the distribution of a grain size $D_G$ extracted from the TEM image of FIG. 11A.

FIG. 12A is a TEM image of a polycrystalline silicon layer formed by crystallizing an amorphous silicon layer having a thickness of 25 nm.

FIG. 12B shows the distribution of the grain size $D_G$ extracted from the TEM image of FIG. 12A.

In the polycrystalline silicon shown in FIGS. 11A and 11B, the average grain size $D_G$ is 259 nm. On the other hand, in the polycrystalline silicon shown in FIGS. 12A and 12B, the average grain size $D_G$ is 123 nm. Thus, the grain size $D_G$ for the case where the thickness of the amorphous silicon layer when crystallizing is 100 nm can be twice that of the case where the thickness is 25 nm. It is considered that this also corresponds to the doubling of the channel mobility $\mu_e$ shown in FIG. 7 to FIG. 9.

For example, if the channel length Lc is set to be 25 nm or less, the grain size $D_G$ can be set to be about 10 times the channel length or more. If the channel width and thickness are set to be 20 nm or less, the grain size $D_G$ can be about 10 times the channel width and thickness or more. A larger grain size $D_G$ can be obtained by further increasing the thickness of the amorphous silicon layer when crystallizing.

The second polycrystalline semiconductor layer stacked on the first polycrystalline semiconductor layer acquires the crystallinity of the underlying layer (the first polycrystalline semiconductor layer). The crystal orientation of the second polycrystalline semiconductor layer is aligned with the crystal orientation of the first polycrystalline semiconductor layer. By increasing the grain size of the first polycrystalline semiconductor layer, the crystallinity (the crystal orientation, the continuity of the interface, etc.) of the second polycrystalline semiconductor layer formed on the first polycrystalline semiconductor layer can be improved; and the characteristics of the transistor can be improved.

FIG. 13 is a schematic view showing the relationship between the semiconductor pillars 4 provided on the major surface 60a of the underlying layer 60 and the grains of the polycrystalline silicon. According to the embodiment, the grain size $D_G$ can be formed to be 10 times the channel width and thickness or more. Accordingly, as shown in this drawing, it is possible to form multiple semiconductor pillars 4 and provide multiple transistors 16 in one grain.

One grain enclosed with a grain boundary GB has a constant crystal orientation. Accordingly, one group of semiconductor pillars 4 formed inside the one grain has the same crystal orientation. On the other hand, the crystal orientations of mutually-adjacent grains are different from each other. Semiconductor pillars 4a to 4f that are formed from different grains have mutually-different crystal orientations.

The multiple transistors including the one group of semiconductor pillars 4 formed from the same grain have the same crystal orientation of the channel length direction. Therefore, for example, the fluctuation of the characteristics (the current and/or the threshold voltage) between the transistors is suppressed.

For example, the region (a first region 91) where semiconductor pillars 4a are provided corresponds to one grain; and the region (a second region 93) where semiconductor pillars 4b are provided corresponds to one grain. Then, the multiple first transistors including the semiconductor pillars 4a and the second transistors including the semiconductor pillars 4b are provided respectively in the regions. A first gate electrode and a second gate electrode are formed respectively in the semiconductor pillars 4a and 4b.

The crystal orientation (a first crystal orientation) of a first channel of the first transistor is different from the crystal orientation (a second crystal orientation) of a second channel of the second transistor. The sizes of the regions where the first and second transistors are provided in the X-Y plane parallel to the major surface 60a of the underlying layer 60 can be 10 times the channel lengths Lc of the first and second transistors or more.

If the size of one block of the memory cell array is designed to be smaller than the size of a region (e.g., the first region 91 or the second region 93) where the semiconductor pillars are formed from the same grain, the transistors included in one block are formed from semiconductor pillars having the same crystal orientation. Therefore, for example, fluctuation of the memory cell array operations can be minimized.

A manufacturing method according to a modification of the embodiment will now be described with reference to FIGS. 14A to 14C.

Figure 14A:
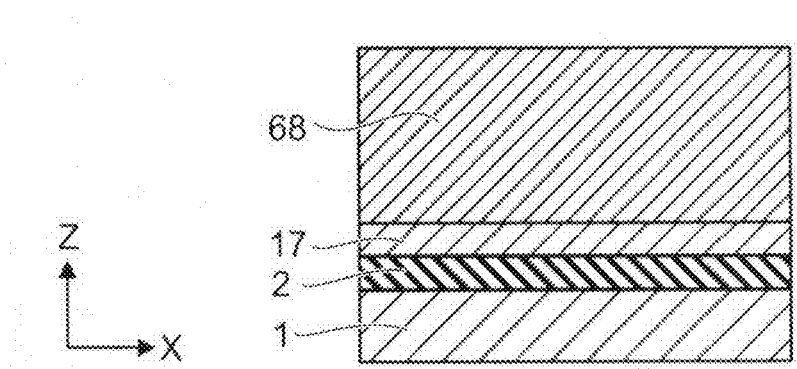
FIGS. 14A to 14C are schematic cross-sectional views showing the manufacturing method according to a variation of the first embodiment.
Figure 14B:
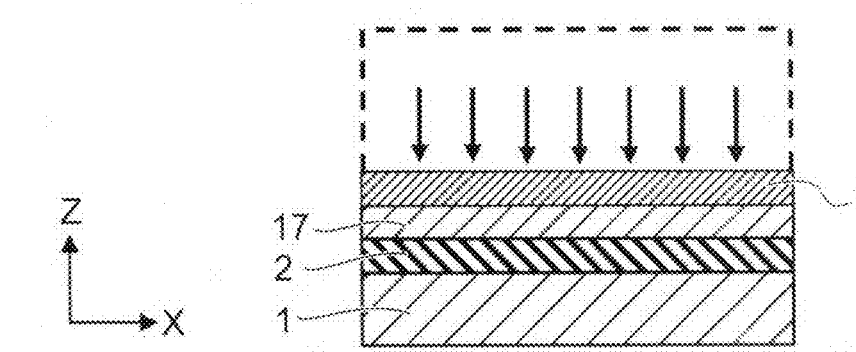
Figure 14C:
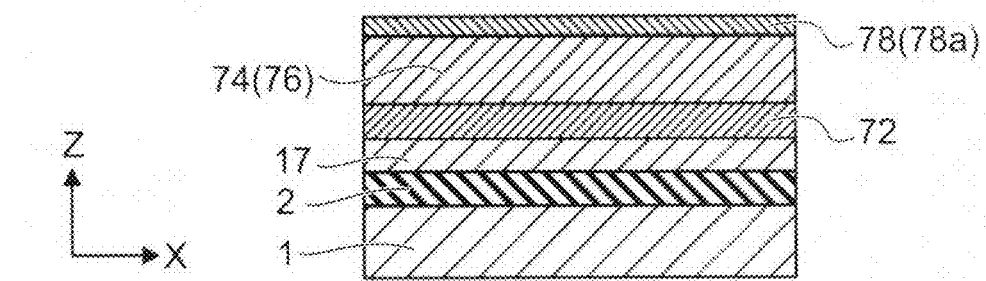

FIG. 14A to FIG. 14C are schematic cross-sectional views showing the manufacturing method according to the modification of the first embodiment.

In the modification as shown in FIG. 14A, the insulator layer 2, the metal layer 17, and a first semiconductor layer 68 are formed on the silicon substrate 1. The first semiconductor layer 68 is, for example, an amorphous silicon layer doped with an n-type impurity. The thickness (the first thickness) of the first semiconductor layer 68 is, for example, not less than 100 nm and not more than 600 nm.

Continuing, a first polycrystalline semiconductor layer 72 is formed by crystallizing the first semiconductor layer 68 by performing heat treatment of the first semiconductor layer 68 (the first process). The heat treatment temperature is, for example, not less than 550° C. and not more than 1200° C. For example, a resistance heating furnace, a RTA furnace, a flash lamp annealing furnace, or the like is used in the heat treatment. In the case where a diffusion furnace is used, the heat treatment time is, for example, several minutes to several tens of hours; and in the case where the RTA furnace is used, the heat treatment time is several seconds to several hundreds of seconds. In the case where the flash lamp annealing furnace is used, millisecond annealing is possible.

Then, as shown in FIG. 14B, the thickness of the first polycrystalline semiconductor layer 72 is reduced to the second thickness that is thinner than the first thickness (the second process). The second thickness is, for example, not less than 10 nm and not more than 80 nm. For example, RIE, wet etching, thermal oxidation, CMP, or the like is used as the method for reducing the thickness of the first polycrystalline semiconductor layer 72.

In the modification, the first polycrystalline semiconductor layer 72 is, for example, an n-type polycrystalline silicon layer that is used to form the source 6 of the transistor 16.

Continuing as shown in FIG. 14C, a second polycrystalline semiconductor layer 74 is formed on the thinned first polycrystalline semiconductor layer 72 (the third process). The second polycrystalline semiconductor layer 74 is formed by, for example, performing heat treatment of a second semiconductor layer 76 formed on the first polycrystalline semiconductor layer 72. The heat treatment conditions are, for example, the same as the heat treatment conditions of the first semiconductor layer 68.

The second semiconductor layer 76 is formed to have the same thickness as the second polycrystalline semiconductor layer 74; and a thickness reduction of the second polycrystalline semiconductor layer that is formed by heat treatment is not performed. The grain aggregate of the second semiconductor layer 76 can be large even when performing heat treatment in the thin layer state (having the second thickness) because the second semiconductor layer 76 is formed on the first polycrystalline semiconductor layer 72 which has a large grain aggregate. The second semiconductor layer 76 can acquire the crystallinity of the first polycrystalline semiconductor layer.

For example, the impurity concentration of the second semiconductor layer 76 is not more than the intrinsic carrier concentration of the semiconductor) or a concentration that is lower than that of the first polycrystalline semiconductor layer 72.

A third polycrystalline semiconductor layer 78 is formed on the second polycrystalline semiconductor layer 74. The third polycrystalline semiconductor layer 78 is, for example, an n-type polycrystalline silicon layer doped with an n-type impurity.

The third polycrystalline semiconductor layer 78 may be, for example, a polycrystalline silicon layer formed by CVD (Chemical Vapor Deposition). The third polycrystalline semiconductor layer 78 may be a polycrystalline silicon layer formed by forming a third semiconductor layer 78a, e.g., a third amorphous silicon layer, on the second semiconductor layer 76 and by subsequently crystallizing by performing heat treatment.

Thereafter, the semiconductor device 100 can be completed according to the manufacturing processes shown in FIG. 3A to FIG. 5B. In the modification, the second polycrystalline semiconductor layer 74 and the third polycrystalline semiconductor layer 78 are patterned respectively into the channel 7 and the drain 8 of the transistor 16.

In the semiconductor device 100 according to the embodiment as recited above, the driving ability of the transistor 16 can be improved by increasing the grain size of the polycrystalline semiconductor layer. Thereby, both the increase of the integration of the memory cells (the number of memory bits) by downscaling the transistor 16 and the increase of the memory programming/reading speed due to the increased driving ability of the transistor 16 can be realized. Also, the S factor of the transistor 16 can be improved; and low power consumption can be realized by reducing the off-leakage current of the memory.

In the embodiment, it is possible for the crystal orientation of the channel length direction of the channel 7 to be matched between the transistors 16 because the multiple semiconductor pillars 4 are formed in an array configuration that is cut out from the same grain. Therefore, it is possible to suppress the fluctuation of the characteristics (the current and/or the threshold voltage) between the transistors.

In the manufacturing method of the embodiment, it is possible to crystallize the first semiconductor layer at a relatively low temperature. Thereby, for example, it is possible to suppress the diffusion of the n-type impurity from the polycrystalline semiconductor layer 18 into the first polycrystalline semiconductor layer 20 and suppress the decrease of the channel mobility $\mu_e$. In the case where the memory control circuit 15 is provided in the silicon substrate 1, it is also possible to suppress degradation of the metal interconnects, etc.

Second Embodiment

Figure 15A:
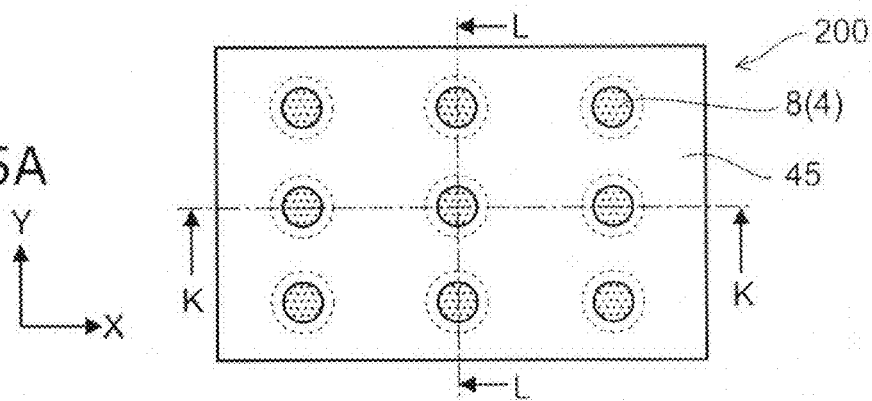
FIGS. 15A to 15C are schematic views showing a semiconductor device according to a second embodiment.
Figure 15B:
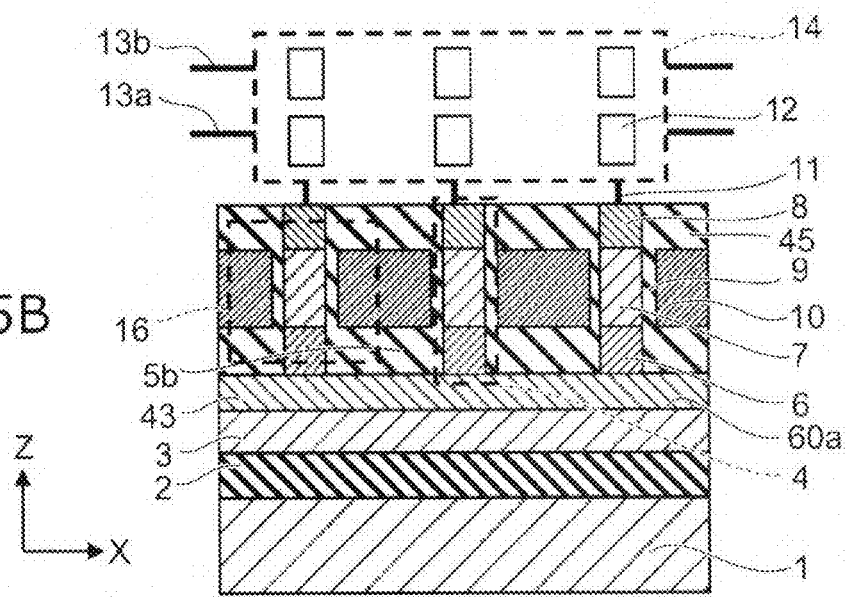
Figure 15C:
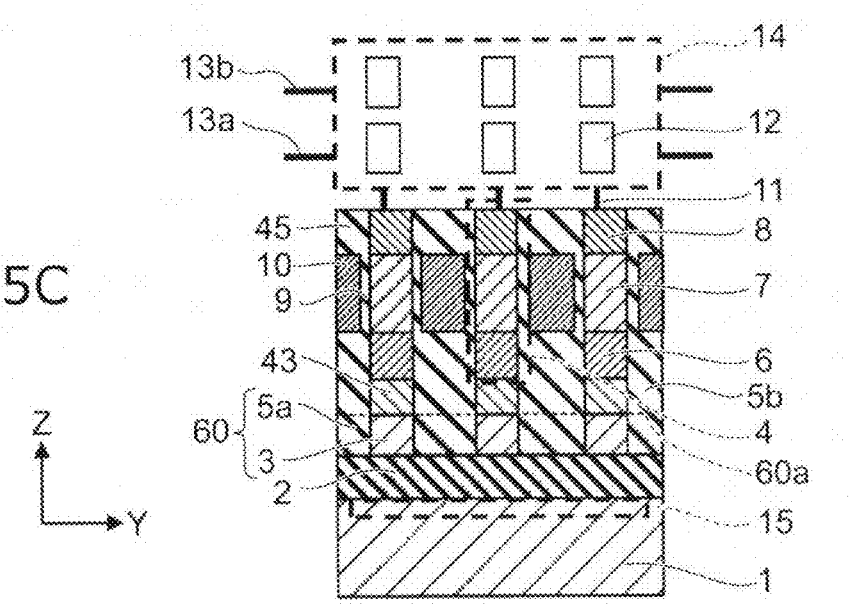

FIGS. 15A to 15C are schematic views showing a semiconductor device 200 according to a second embodiment.

FIG. 15A is a top view of the semiconductor device 200.

FIG. 15B is a schematic cross-sectional view along line A-A of FIG. 1A.

FIG. 15C is a schematic cross-sectional view along line B-B.

In the embodiment as well, the underlying layer 60 that includes the metal layers 3 and the insulator layer 5a is provided on the silicon substrate 1. The memory control circuit 15 may be formed between the silicon substrate 1 and the insulator layer 2 (referring to FIGS. 1A to 1C).

Polycrystalline semiconductor interconnects 43 are provided on the metal layers 3. The polycrystalline semiconductor interconnects 43 function with the metal layers 3 as, for example, global bit lines. Then, the multiple transistors are provided on the polycrystalline semiconductor interconnects 43.

The transistors 16 include the semiconductor pillars 4; and the semiconductor pillars 4 are insulated from each other by the insulator layers 5b and 45. The semiconductor pillar 4 has a structure in which the source 6, the channel 7, and the drain 8 are stacked in order on the polycrystalline semiconductor interconnect 43. The source 6 and the drain 8 are doped with an n-type impurity. The gate electrodes 10 are provided at two (X-direction) sides of the channel 7 with the gate insulating film 9 interposed.

The memory cell array 14 is provided on the transistors 16 with the metal interconnects 11 interposed. The memory cell array 14 includes the multiple memory cells 12, and the interconnects 13a and 13b that control the memory cells 12. The metal interconnects 11 electrically connect the transistors 16 to the memory cells 12.

The thickness and width of the channel 7 of the transistor 16 is, for example, 3 nm to 30 nm. The channel length Lc is, for example, not more than 25 nm. The average grain size of the channel 7 is not less than 10 times the channel length.

The method for manufacturing the semiconductor device 200 will now be described.

FIG. 16A to FIG. 20B is a schematic view showing the method for manufacturing the semiconductor device 200.

Figure 16A:
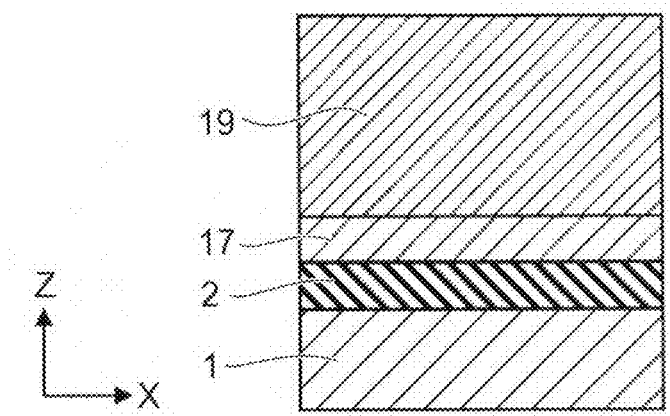
FIGS. 16A to 20B are schematic views showing the method for manufacturing the semiconductor device according to the second embodiment.
Figure 16B:
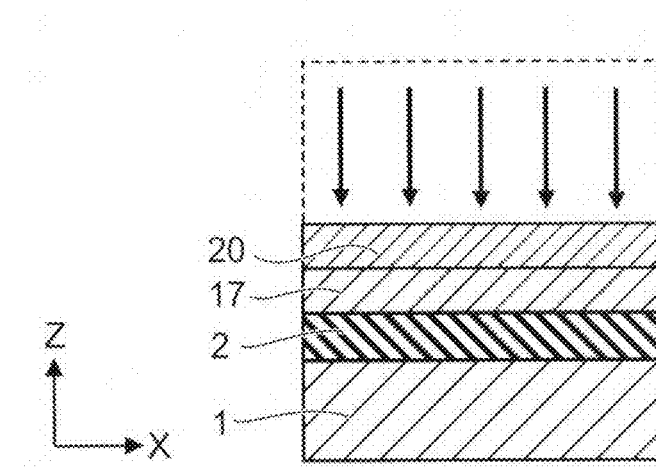

FIG. 16A and FIG. 16B are partial cross-sections of the silicon substrate 1 in manufacturing processes of the semiconductor device 200.

Figure 17A:
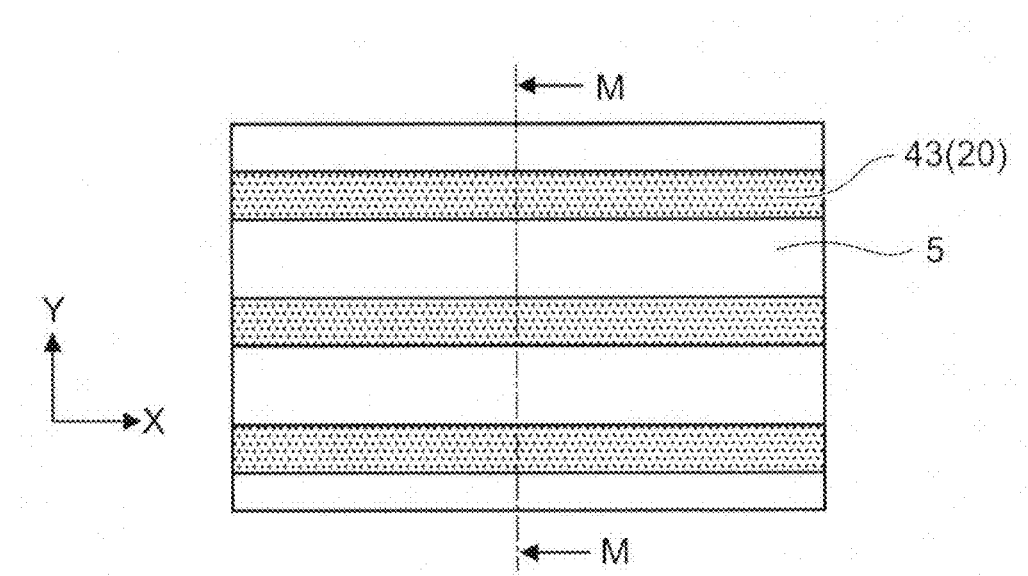
Figure 19A:
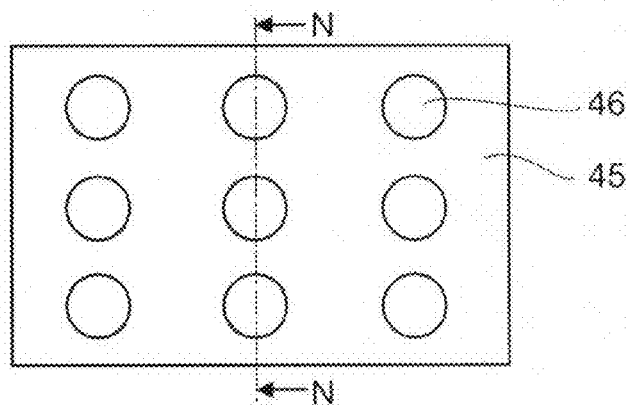
Figure 20A:
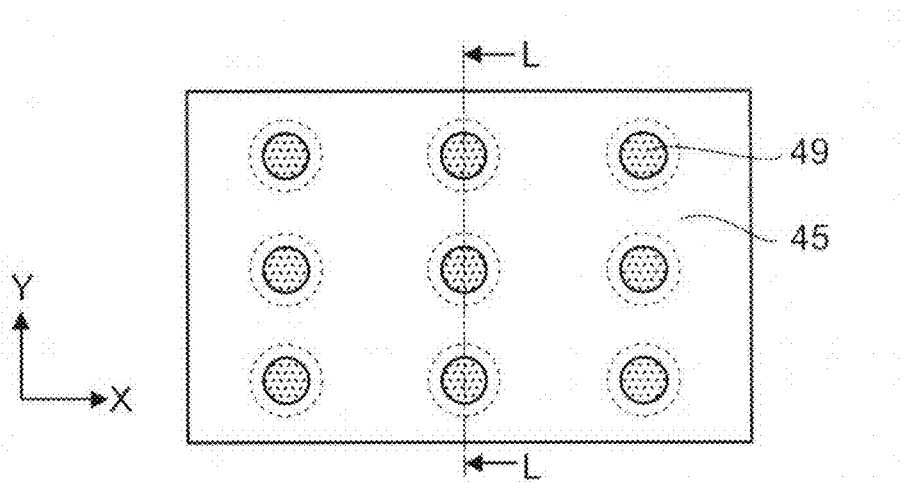

FIG. 17A, FIG. 19A, and FIG. 20A are plan views showing the upper surface of the silicon substrate 1.

Figure 17B:
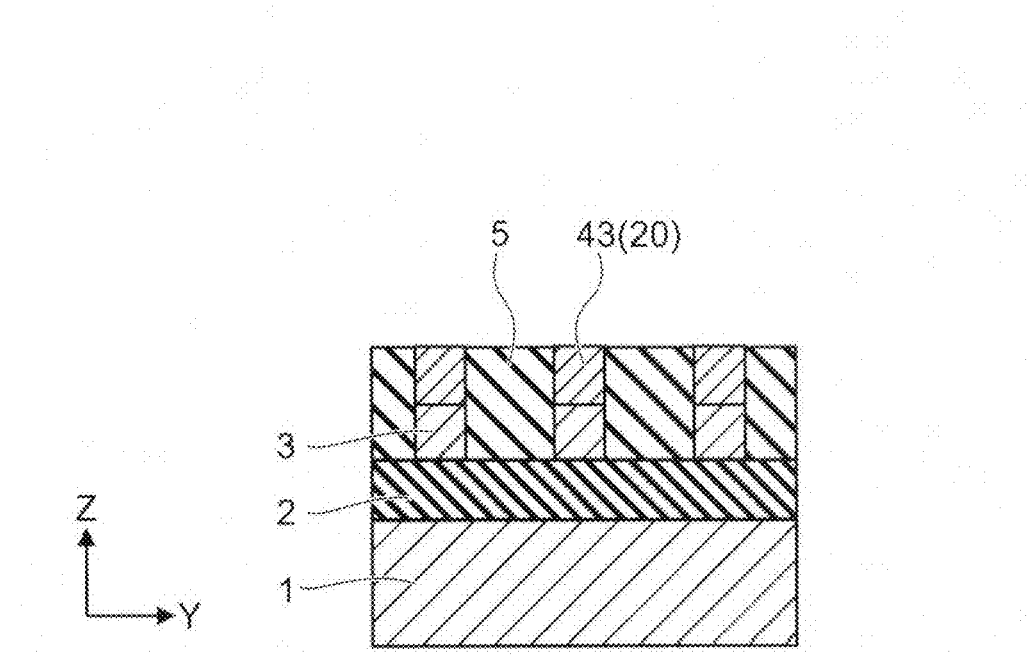
Figure 18:
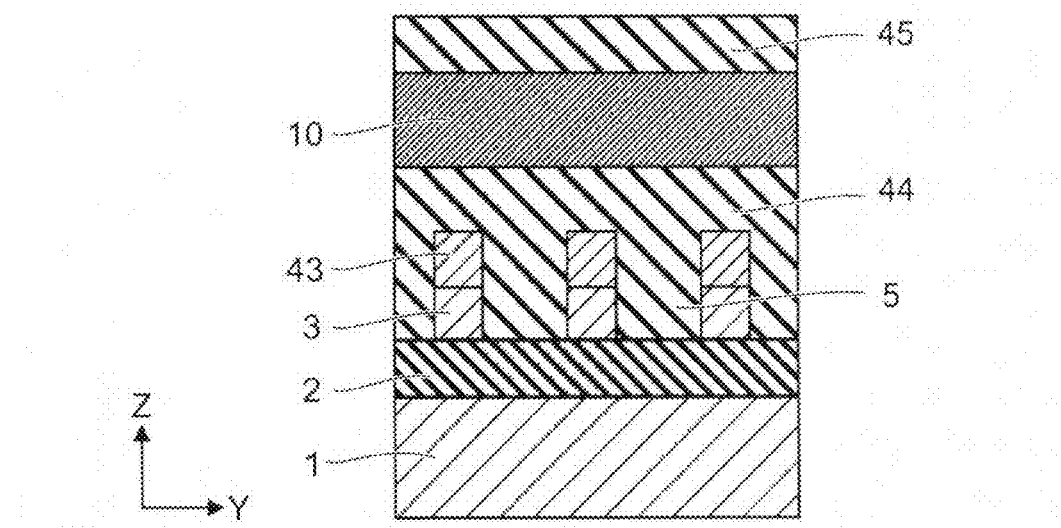
Figure 19B:
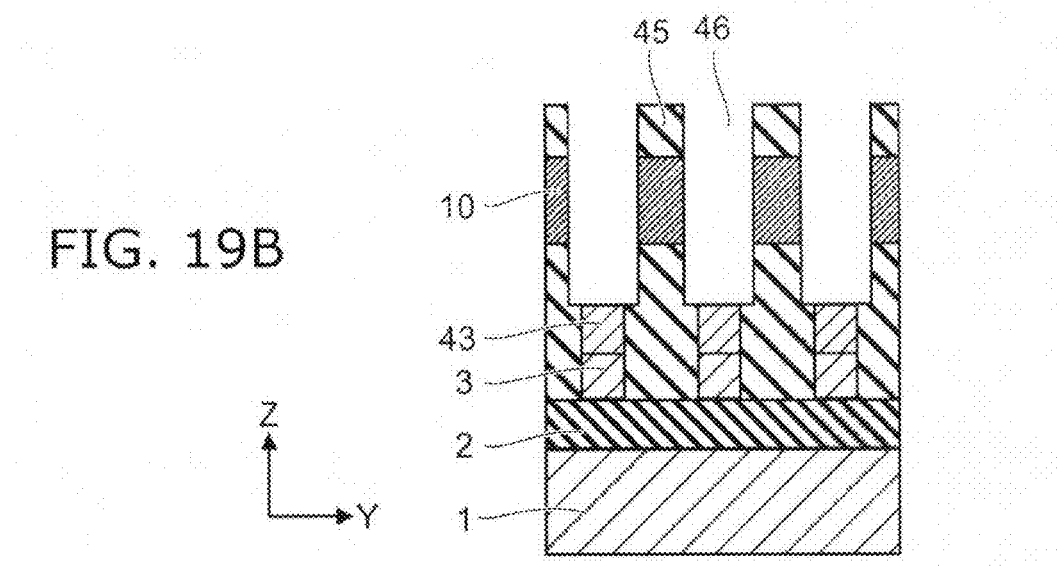
Figure 20B:
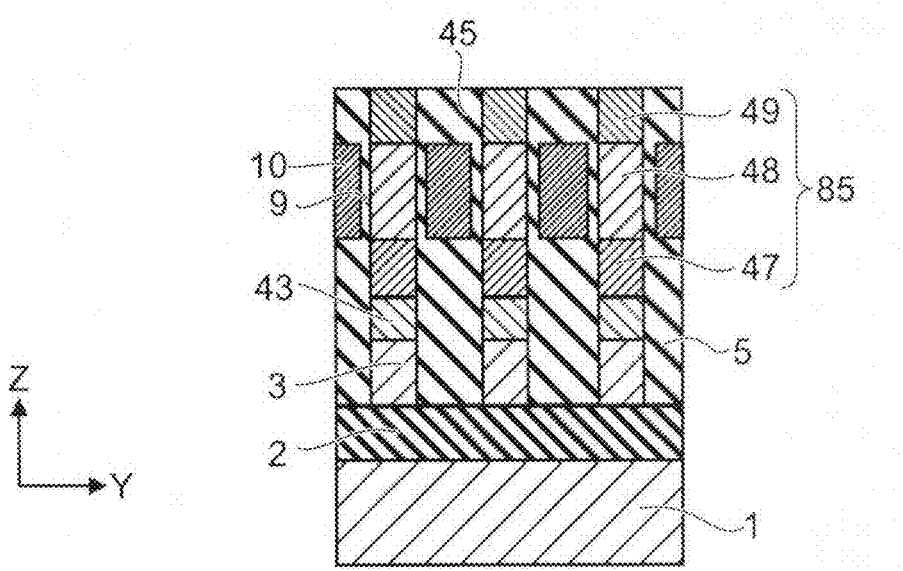

FIG. 17B, FIG. 19B, and FIG. 20B are cross-sectional views along line M-M, line N-N, and line L-L of FIG. 17A to FIG. 20A, respectively.

First, as shown in FIG. 16A, the insulator layer 2, the metal layer 17, and the first semiconductor layer 19 are formed on the silicon substrate 1. The first semiconductor layer 19 is, for example, an amorphous silicon layer doped with an n-type impurity. The thickness (the first thickness) of the first semiconductor layer 19 is, for example, not less than 100 nm and not more than 600 nm.

Continuing, the first polycrystalline semiconductor layer is formed by performing heat treatment of the first semiconductor layer 19 (the first process). Then, as shown in FIG. 16B, the thickness of the first polycrystalline semiconductor layer 20 is reduced to the second thickness (the second process). The second thickness is, for example, not less than 10 nm and not more than 80 nm.

The heat treatment temperature of the first semiconductor layer 19 is, for example, not less than 550° C. and not more than 1200° C. In the case where a resistance heating furnace is used, the heat treatment time is several minutes to several tens of hours; and in the case where a RTA furnace is used, the heat treatment time is several seconds to several hundreds of seconds. Other than the resistance heating furnace and the RTA furnace, a millisecond annealing apparatus such as a flash lamp annealing furnace, etc., may be used.

RIE, wet etching, thermal oxidation, CMP, etc., can be used to reduce the film thickness.

Thus, the grain size of the first polycrystalline semiconductor layer 20 can be increased by reducing the thickness of the first semiconductor layer 19 after the heat treatment of the first semiconductor layer 19 having the first thickness.

Then, as shown in FIGS. 17A and 17B, the metal layers 3 and the polycrystalline semiconductor interconnects 43 are formed by patterning the metal layer 17 and the first polycrystalline semiconductor layer 20. For example, the metal layers 3 and the polycrystalline semiconductor interconnects 43 are formed in stripe configurations extending in the X direction by patterning (removing portions of) the metal layer 17 and the first polycrystalline semiconductor layer 20 by RIE. Then, the insulator layer 5 is filled between the stacked bodies of the metal layers 3 and the polycrystalline semiconductor interconnects 43. The insulator layer 5 is, for example, a silicon oxide film.

Continuing as shown in FIG. 18, an insulator layer 44, the gate electrode 10, and the insulator layer 45 are formed in order on the polycrystalline semiconductor interconnects 43 and the insulator layer 5.

Then, as shown in FIGS. 19A and 19B, openings 46 are made by patterning the insulator layer 45, the gate electrode 10, and the insulator layer 44. The polycrystalline semiconductor interconnects 43 are exposed at the bottom surfaces of the openings 46.

Continuing as shown in FIG. 20A, the gate insulating film 9 is formed in the interiors of the openings 46. Continuing, a second semiconductor layer 85 is formed in the interiors of the openings 46 (the third process). The second semiconductor layer 85 has a first portion 47, a second portion 48, and a third portion 49 provided in order from the side of the polycrystalline semiconductor interconnect 43. The first portion 47 is, for example, a layer that is doped with an impurity (e.g., an n-type impurity) at a first concentration. The impurity concentration of the second portion 48 is lower than the impurity concentration of the first portion 47. The second portion 48 is, for example, a non-doped layer. The third portion 49 is, for example, a layer doped with an impurity (e.g., an n-type impurity). The second semiconductor layer 85 is, for example, an amorphous silicon layer.

Continuing, a second polycrystalline semiconductor layer (the semiconductor pillars 4) is formed by performing heat treatment of the second semiconductor layer 85. The semiconductor pillar 4 includes the source 6 formed by crystallizing the first portion 47, the channel 7 formed by crystallizing the second portion 48, and the drain 8 formed by crystallizing the third portion 49.

The crystallization of the second semiconductor layer 85 progresses with the grain of the polycrystalline semiconductor interconnect 43 contacting the first portion 47 as a seed. As described above, because the size of the grains included in the polycrystalline semiconductor interconnects 43 is increased, the size of the grains included in the second polycrystalline semiconductor layer also can be increased.

By the processes recited above, the semiconductor device 200 is completed by forming the transistors 16 and by subsequently forming the memory cell array 14 on the transistors 16 (referring to FIGS. 15A to 15C).

In the embodiment as well, it is possible to increase the channel mobility $\mu_e$ by increasing the grain size of the semiconductor pillar 4 of the transistor 16 that includes the channel 7. Thereby, the driving ability of the transistor 16 can be improved and the memory programming/reading speed can be increased while increasing the integration (the number of memory bits) in the surface by downscaling the transistor 16. Further, it is possible to improve the S factor of the transistor 16; and low power consumption can be realized by reducing the off-leakage current of the memory.

In the manufacturing method of the embodiment, the second semiconductor layer 85 is crystallized using the grain of the polycrystalline semiconductor interconnect 43 as a seed crystal. Therefore, it is possible for the temperature of the heat treatment to be lower. For example, the heat treatment can be implemented at a relatively low temperature of about 600° C. Thereby, the diffusion of the n-type impurity that is doped into the second semiconductor layer and the fourth semiconductor layer can be suppressed; and the decrease of the channel mobility $\mu_e$ can be suppressed. In the case where the memory control circuit is formed in the silicon substrate of the lower layer, thermal damage of the memory control circuit can be suppressed.

Although the second semiconductor layer 85 is formed selectively in the embodiment, the second polycrystalline semiconductor layer may be formed by performing heat treatment after forming the second semiconductor layer 85 over the entire surface of the silicon substrate 1 and by patterning the second polycrystalline semiconductor layer into the semiconductor pillars 4 similarly to the first embodiment.

Third Embodiment

Figure 21A:
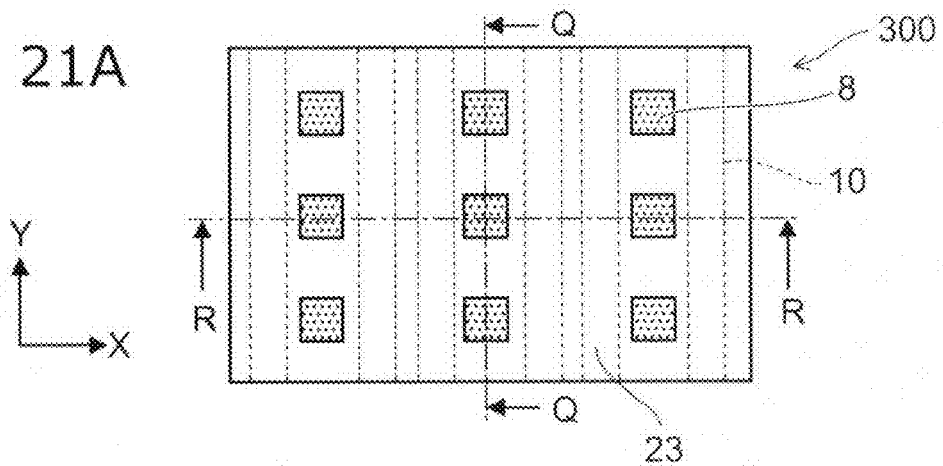
FIGS. 21A to 21C are schematic views showing a semiconductor device according to a third embodiment.
Figure 21B:
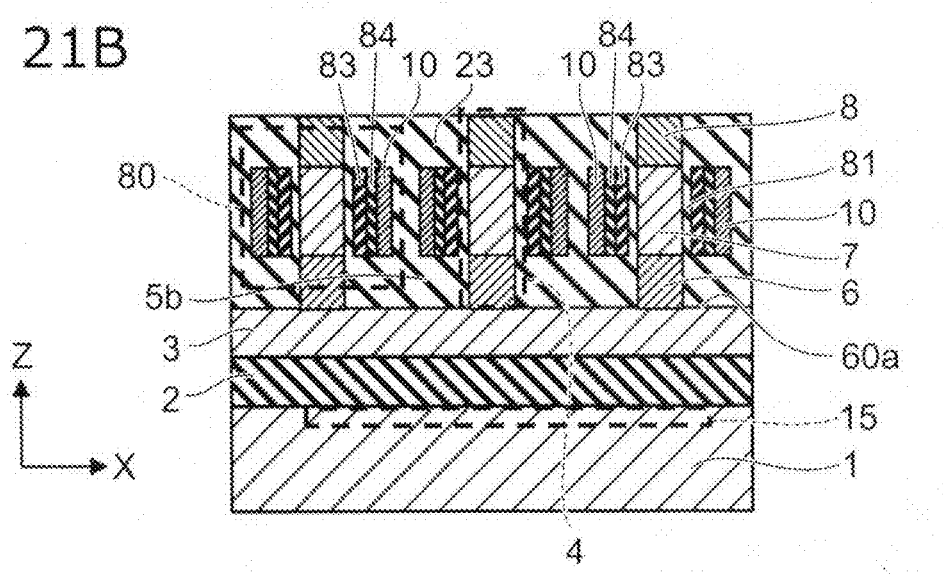
Figure 21C:
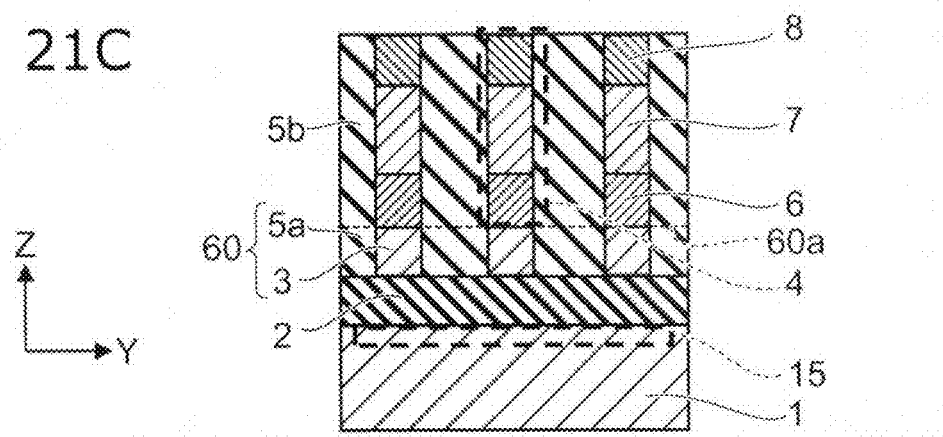

FIGS. 21A to 21C are schematic views showing a semiconductor device 300 according to a third embodiment.

FIG. 21A is a top view of the semiconductor device 300.

FIG. 21B is a schematic cross-sectional view along line R-R of FIG. 21A.

FIG. 21C is a schematic cross-sectional view along line Q-Q.

In the embodiment as well, the underlying layer 60 that includes the metal layers 3 and the insulator layer 5a is provided on the silicon substrate 1. The multiple transistors 80 are provided on the metal layers 3. The transistors 80 include the semiconductor pillars 4. The semiconductor pillars 4 are insulated from each other by the insulator layers 5b and 23. The semiconductor pillar 4 has a structure in which the source 6, the channel 7, and the drain 8 are stacked in order on the polycrystalline semiconductor interconnect 43. The source 6 and the drain 8 are doped with an n-type impurity.

The gate electrodes 10 are provided at two (X-direction) sides of the channel 7 with the gate insulating film 9 interposed. Further, a charge retaining layer is provided between the gate insulating film 9 and the gate electrode 10 in the embodiment. In the example, a charge storage layer 83 is provided as the charge retaining layer. A tunneling insulating film 81 is provided as the gate insulating film 9 between the charge storage layer 83 and the channel 7. A blocking insulating film 84 (a control insulating film) is provided between the charge storage layer 83 and the gate electrode 10. A floating gate layer may be provided instead of the charge storage layer 83. The floating gate layer functions as the charge retaining layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
an underlying layer including an insulator layer, and a metal layer provided on the insulator layer, the underlying layer including a first region and a second region; and
a plurality of transistors arranged in a plane parallel to an upper surface of the underlying layer, the plurality of transistors including a first transistor provided on the first region and a second transistor provided on the second region, each of the first and second transistors including a semiconductor pillar provided on the metal layer, the semiconductor pillar providing a channel allowing a current to flow in a first direction intersecting the plane,
a first channel of the first transistor having a first conductivity type and a first crystal orientation along the first direction; a second channel of the second transistor having the first conductivity type and a second crystal orientation along the first direction; and the second crystal orientation being different from the first crystal orientation.

2. The device according to claim 1, wherein a length of the first region in a second direction parallel to the plane is not less than 10 times a length of the channel of each transistor in the first direction.

3. The device according to claim 1, wherein
the channel of each transistor has a side surface along the first direction, and
each transistor includes:
a gate electrode facing the side surface; and
a gate insulating film provided between the gate electrode and the side surface.

4. The device according to claim 1, wherein the semiconductor pillar includes a source provided on the metal layer, the channel provided on the source, and a drain provided on the channel.

5. The device according to claim 1, wherein the semiconductor pillar is a nanowire extending in the first direction.

6. The device according to claim 1, further comprising a memory cell array including a plurality of memory cells,
wherein the transistors are disposed between the underlying layer and the memory cell array, and configured to control an operation of the plurality of memory cells.

7. The device according to claim 1, wherein
the channel has a side surface along the first direction, and
each of the transistors includes:
a gate electrode facing the side surface;
a gate insulating film provided between the gate electrode and the side surface; and
a charge retaining layer provided between the gate electrode and the gate insulating film.

* * * * *